(12) United States Patent
Wagatsuma et al.

(10) Patent No.: US 12,347,676 B2
(45) Date of Patent: Jul. 1, 2025

(54) SUBSTRATE PROCESSING METHOD AND SUBSTRATE PROCESSING SYSTEM

(71) Applicant: Tokyo Electron Limited, Tokyo (JP)

(72) Inventors: Yuichiro Wagatsuma, Nirasaki (JP); Masahisa Watanabe, Nirasaki (JP); Mayuko Nakamura, Nirasaki (JP); Takashi Sakuma, Nirasaki (JP); Osamu Yokoyama, Nirasaki (JP); Kwangpyo Choi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 48 days.

(21) Appl. No.: 17/934,668

(22) Filed: Sep. 23, 2022

(65) Prior Publication Data

US 2023/0094053 A1    Mar. 30, 2023

(30) Foreign Application Priority Data

Sep. 27, 2021    (JP) ................................. 2021-157218

(51) Int. Cl.
*H01L 21/02*    (2006.01)
*H01L 21/306*    (2006.01)

(52) U.S. Cl.
CPC .. *H01L 21/02293* (2013.01); *H01L 21/02123* (2013.01); *H01L 21/02172* (2013.01); *H01L 21/306* (2013.01)

(58) Field of Classification Search
None
See application file for complete search history.

(56) References Cited

U.S. PATENT DOCUMENTS

| | | | |
|---|---|---|---|
| 2008/0044932 A1* | 2/2008 | Samoilov | H01L 29/66272 257/E21.309 |
| 2021/0184037 A1* | 6/2021 | Sung | H01L 21/823425 |

FOREIGN PATENT DOCUMENTS

| | | | |
|---|---|---|---|
| EP | 0747941 A2 * | 12/1996 | ........... H01L 21/336 |
| JP | H04-320329 A | 11/1992 | |
| JP | H11-087266 A | 3/1999 | |
| JP | 2009-117555 A | 5/2009 | |
| JP | 2009-533877 A | 9/2009 | |
| JP | 2017-022302 A | 1/2017 | |
| JP | 2018-148193 A | 9/2018 | |
| KR | 10-2018-0103022 A | 9/2018 | |
| KR | 10-2020-0019764 A | 2/2020 | |
| KR | 10-2021-0007860 A | 1/2021 | |

OTHER PUBLICATIONS

Xu et al, CN 110998791A Method of Depositing a Semiconductor Film, Apr. 10, 2020. (Year: 2020).*

* cited by examiner

*Primary Examiner* — Alexander G Ghyka
(74) *Attorney, Agent, or Firm* — Armstrong Teasdale LLP

(57) ABSTRACT

A substrate processing method includes: preparing a substrate which includes a base having an epitaxial layer formed by epitaxial growth, and an insulating film formed on the base and having a penetration portion that exposes the epitaxial layer; forming a silicon film on a surface of the epitaxial layer exposed from the penetration portion rather than a side wall of the penetration portion; and forming a metal film on the silicon film formed on the surface of the epitaxial layer rather than the side wall of the penetration portion, and causing the silicon film to react with the metal film to form a metal silicide film.

15 Claims, 11 Drawing Sheets

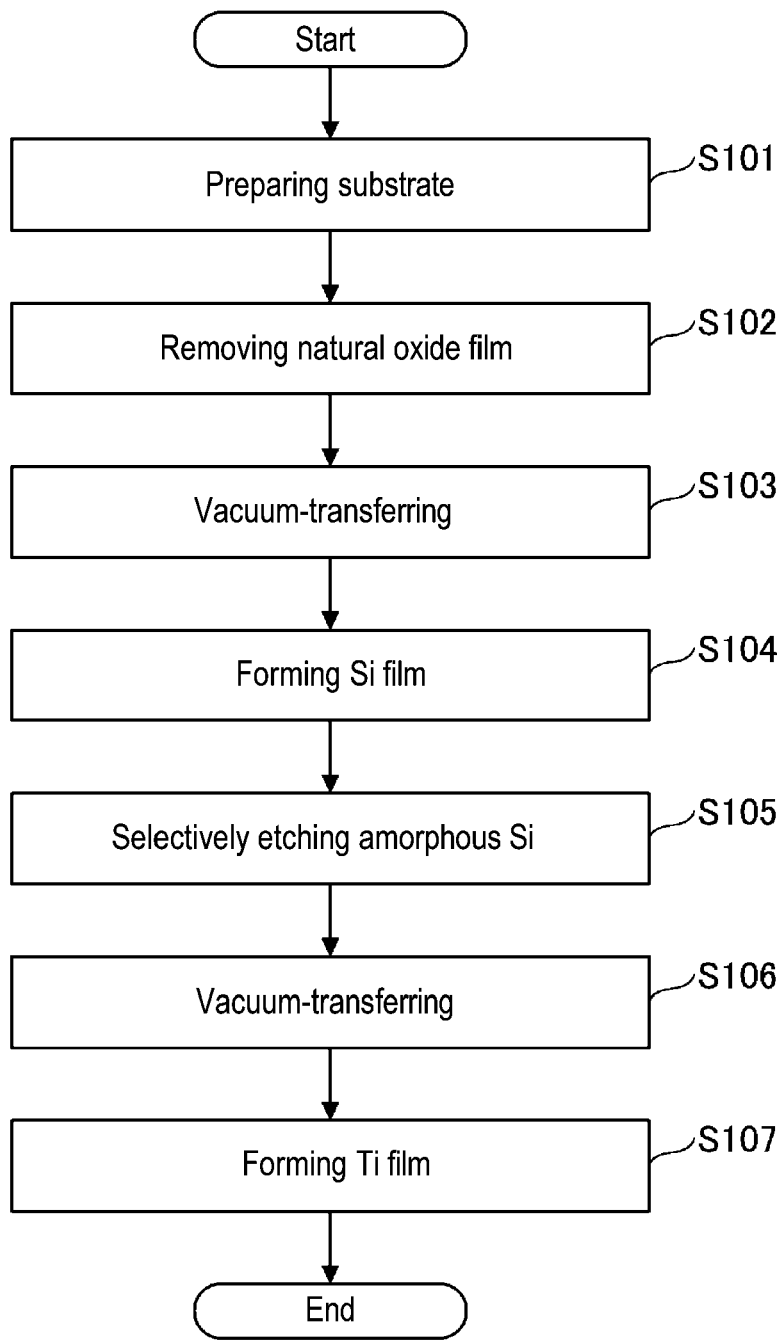

SUBSTRATE PROCESSING METHOD AND SUBSTRATE PROCESSING SYSTEM

CROSS-REFERENCE TO RELATED APPLICATION

This application is based upon and claims the benefit of priority from Japanese Patent Application No. 2021-157218, filed on Sep. 27, 2021, the entire contents of which are incorporated herein by reference.

TECHNICAL FIELD

The present disclosure relates to a substrate processing method and a substrate processing system.

BACKGROUND

Patent Document 1 discloses an oxide film removing method of removing a natural oxide film formed on a surface of silicon at a bottom of a pattern such as a contact hole or a trench. In addition, Patent Document 1 discloses a contact forming method, in which a metal film is formed after removing the natural oxide film, and the silicon at the bottom of the pattern is caused to react with the metal film to form a contact at the bottom of the pattern.

PRIOR ART DOCUMENT

Patent Document

Patent Document 1: Japanese Patent Laid-Open Publication No. 2018-148193

SUMMARY

According to one embodiment of the present disclosure, a substrate processing method includes: preparing a substrate which includes a base having an epitaxial layer formed by epitaxial growth, and an insulating film formed on the base and having a penetration portion that exposes the epitaxial layer; forming a silicon film on a surface of the epitaxial layer exposed from the penetration portion rather than a side wall of the penetration portion; and forming a metal film on the silicon film formed on the surface of the epitaxial layer rather than the side wall of the penetration portion, and causing the silicon film to react with the metal film to form a metal silicide film

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is an example of a flowchart illustrating a substrate processing method by the substrate processing system.

DETAILED DESCRIPTION

Figure 1:
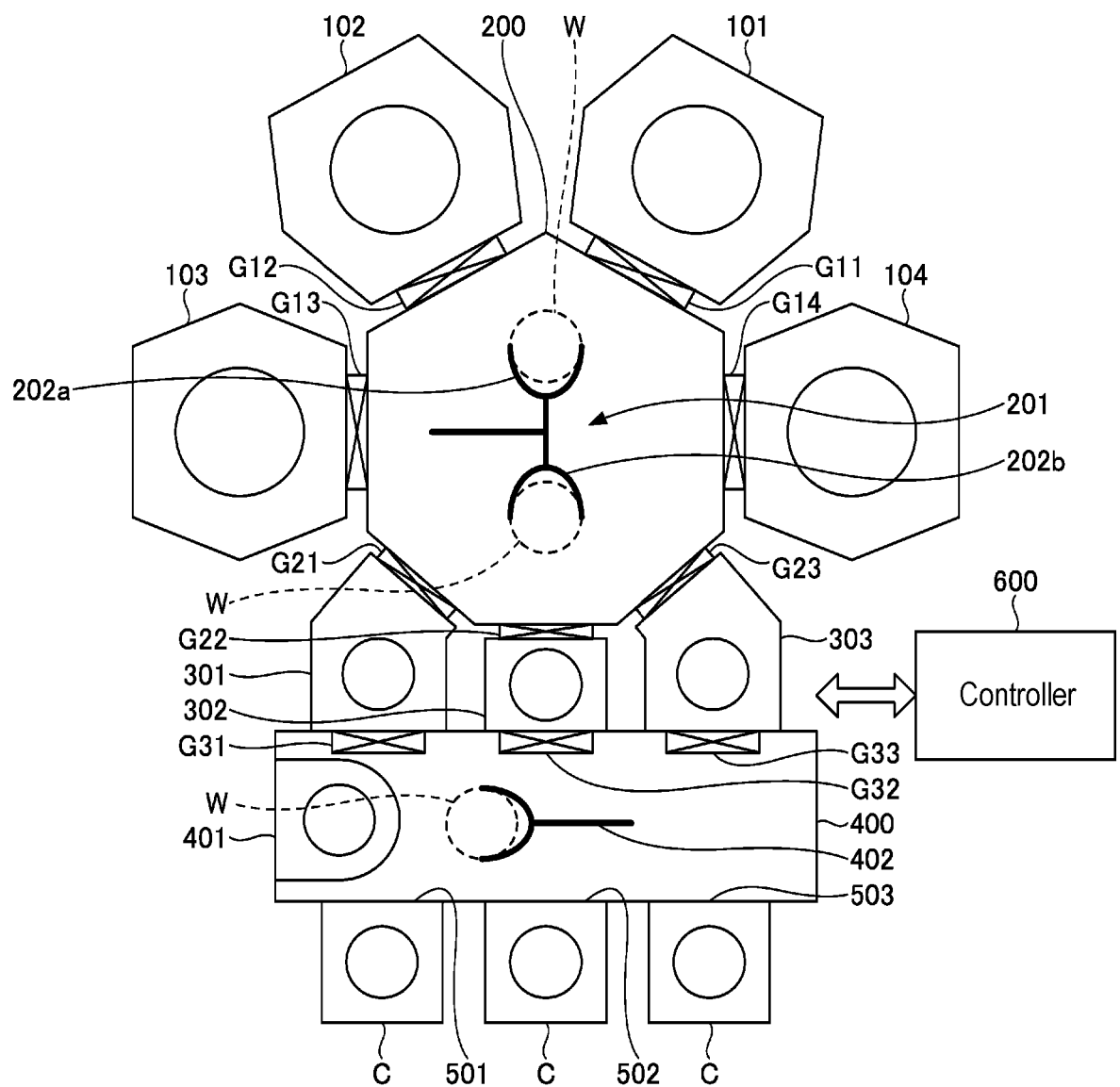
FIG. 1 is a schematic view illustrating a configuration example of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings. In each drawing, the same or corresponding components may be denoted by the same reference numerals, and a description thereof may be omitted.

[Substrate Processing System]

A substrate processing system according to an embodiment will be described with reference to FIG. 1. FIG. 1 is a schematic view illustrating an exemplary configuration of a substrate processing system.

As illustrated in FIG. 1, the substrate processing system includes processing apparatuses 101 to 104, a vacuum transfer chamber 200, load-lock chambers 301 to 303, an atmospheric transfer chamber 400, and load ports 501 to 503, and a controller 600.

The processing apparatuses 101 to 104 are connected to the vacuum transfer chamber 200 via gate valves G11 to G14, respectively. Interiors of the processing apparatuses 101 to 104 are depressurized to a predetermined vacuum atmosphere, and each of the processing apparatuses 101 to 104 performs therein a desired process on a substrate W such as a wafer, respectively. The processing apparatus 101 is an apparatus configured to remove a natural oxide film formed at a bottom of a recess in the substrate W. The processing apparatus 102 is an apparatus configured to selectively form a silicon film (hereinafter, also referred to as a "Si film") at the bottom of the recess in the substrate W. The processing apparatus 103 is an apparatus configured to selectively form a metal silicide film at the bottom of the recess in the substrate W by forming a metal film on the substrate W. The processing apparatus 104 may be an apparatus which is the same as any of the processing apparatuses 101 to 103, or may be an apparatus that performs a separate process. The processing apparatuses 101 to 103 will be described later with reference to FIGS. 2 to 4.

An interior of the vacuum transfer chamber 200 is depressurized to a predetermined vacuum atmosphere. The vacuum transfer chamber 200 is provided with a transfer mechanism 201 capable of transferring the substrate W in a depressurized state. The transfer mechanism 201 transfers the substrate W with respect to the processing apparatuses 101 to 104 and the load-lock chambers 301 to 303. The transfer mechanism 201 includes, for example, two transfer arms 202a and 202b.

The load-lock chambers 301 to 303 are connected to the vacuum transfer chamber 200 via gate valves G21 to G23, respectively, and connected to the atmospheric transfer chamber 400 via the gate valves G31 to G33, respectively. Interiors of the load-lock chambers 301 to 303 are configured to be switchable between atmospheric atmosphere and vacuum atmospheres.

Interior of the atmospheric transfer chamber 400 has atmospheric atmosphere and, for example, a downflow of clean air is formed in the atmospheric transfer chamber 400. In the atmospheric transfer chamber 400, an aligner 401 is provided to perform alignment of the substrate W. In addition, the atmospheric transfer chamber 400 is provided with a transfer mechanism 402. The transfer mechanism 402 transfers the substrate W with respect to the load-lock chambers 301 to 303, carriers C in the load ports 501 to 503 to be described later, and the aligner 401.

The load ports 501 to 503 are provided in a wall surface of a long side of the atmospheric transfer chamber 400. A carrier C accommodating the substrate W, or an empty carrier C is attached in each of the load ports 501 to 503. As the carriers C, for example, front opening unified pods (FOUPs) may be used.

The controller 600 controls respective components of the substrate processing system. For example, the controller 600 executes operations of the processing apparatuses 101 to 104, operations of the transfer mechanisms 201 and 402, opening and closing of the gate valves G11 to G14, G21 to G23, and G31 to G33, and switching of the atmospheres in the load-lock chambers 301 to 303. The controller 600 may be, for example, a computer.

In addition, the configuration of the substrate processing system is not limited to those described above. The substrate processing system may be configured to have a batch type apparatus configured to process a plurality of substrates W in a single processing apparatus. In addition, the vacuum transfer chamber may have a configuration in which the batch type apparatus is connected to the vacuum transfer chamber via a gate valve, or may have a configuration in which a plurality of vacuum transfer devices is provided in the vacuum transfer chamber.

[Processing Apparatus 101]

Figure 2:
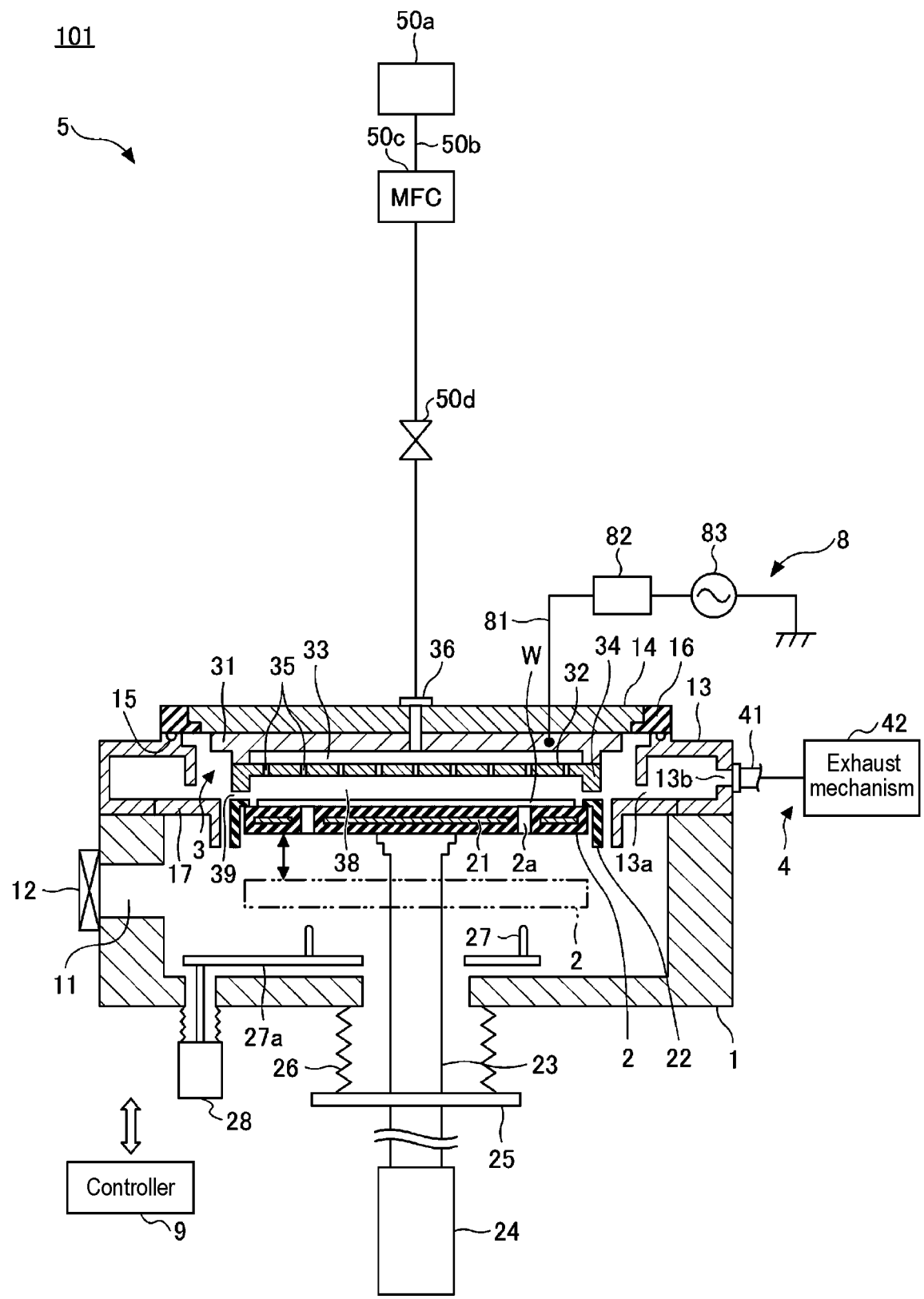
FIG. 2 is an example of a schematic view illustrating a configuration example of a processing apparatus.

Next, the processing apparatus 101 will be described with reference to FIG. 2. FIG. 2 is an example of a schematic view illustrating a configuration example of the processing apparatus 101. The processing apparatus 101 is an apparatus configured to remove a natural oxide film formed at the bottom of the recess in the substrate W within the processing container 1 under a depressurized state.

As illustrated in FIG. 2, the processing apparatus 101 includes the processing container 1, a stage 2, a shower head 3, an exhauster 4, a gas supply mechanism 5, an RF power supply 8, and a controller 9.

The processing container 1 is made of a metal such as aluminum, and has a substantially cylindrical shape. The processing container 1 accommodates the substrate W. A load/unload port 11 is formed in a side wall of the processing container 1 for loading and unloading the substrate W, and is opened and closed by a gate valve 12 (the gate valve G11 illustrated in FIG. 1). An annular exhaust duct 13 having a rectangular cross section is provided on a main body of the processing container 1. A slit 13a is formed along an inner peripheral surface of the exhaust duct 13. An exhaust port 13b is formed in the outer wall of the exhaust duct 13. On a top surface of the exhaust duct 13, a ceiling wall 14 is provided to close an upper opening of the processing container 1 via an insulator 16. A space between the exhaust duct 13 and the insulator 16 is hermetically sealed with a seal ring 15. A partition 17 partitions an interior of the processing container 1 into upper and lower portions when the stage 2 (and a cover 22) is raised to a processing position.

The stage 2 horizontally supports the substrate W in the processing container 1. The stage 2 is formed in a disk shape having a size corresponding to the substrate W, and is supported by a support 23. The stage 2 is formed of a ceramic material such as AlN or a metallic material such as aluminum or nickel alloy, and a heater 21 configured to heat the substrate W is embedded in the stage 2. The heater 21 generates heat by being fed with power from a heater power supply (not illustrated). The substrate W is controlled to a predetermined temperature by controlling an output of the heater 21 by a temperature signal of a thermocouple (not illustrated) provided in a vicinity of a top surface of the stage 2. The stage 2 may include an electrostatic chuck configured to electrostatically attract the substrate W. By providing the electrostatic chuck, the substrate W is electrostatically attracted to a surface of the stage 2, and thus it is possible to control the temperature of the substrate W with high accuracy. In addition, the stage 2 may be provided with a flow path therein, so that a temperature control coolant from outside may flow and circulate through the flow path. The stage 2 is provided with the cover 22 formed of ceramic such as alumina to cover an outer peripheral region of the top surface and a side surface of the stage 2.

The support 23 that supports the stage 2 is provided on a bottom surface of the stage 2. The support 23 extends downward from a center of the bottom surface of the stage 2 to below the processing container 1 via a hole formed in a bottom wall of the processing container 1, and a lower end of the support 23 is connected to a lifting mechanism 24. The stage 2 is raised and lowered, by the lifting mechanism 24 via the support 23, between the processing position illustrated in FIG. 2 and a transfer position, which is indicated by the alternating long and two short dashes line below the processing position, and at which the substrate W is capable of being transferred. A flange 25 is provided on the support 23 below the processing container 1, and a bellows 26, which partitions an atmosphere in the processing container 1 from the outside air, is provided between a bottom surface of the processing container 1 and the flange 25 to expand and contract in response to a vertical movement of the stage 2.

Three substrate support pins 27 (only two of which are illustrated) are provided in a vicinity of the bottom surface of the processing container 1 to protrude upward from a lifting plate 27a. The substrate support pins 27 are raised and lowered by a lifting mechanism 28 provided below the processing container 1 via the lifting plate 27a. The substrate support pins 27 are configured to be inserted into throughholes 2a formed in the stage 2 located at the transfer position, and are configured to protrude and sink with respect to the top surface of the stage 2. By raising and lowering the substrate support pins 27, a delivery of the substrate W is performed between a transfer mechanism (not illustrated) and the stage 2.

The shower head 3 supplies a processing gas into the processing container 1 in a shower form. The shower head 3 is made of a metal and provided to face the stage 2, and has a diameter, which is substantially equal to that of the stage 2. The shower head 3 includes a main body 31 fixed to the ceiling wall 14 of the processing container 1 and a shower plate 32 connected below the main body 31. A gas diffusion space 33 is formed between the main body 31 and the shower plate 32. In the gas diffusion space 33, a gas introduction hole 36 is provided to penetrate centers of the main body 31 and the ceiling wall 14 of the processing container 1. An annular protrusion 34 protruding downward is formed on a peripheral edge of the shower plate 32. Gas ejection holes 35 are formed in a flat surface inward of the annular protrusion 34. In a state in which the stage 2 is located at the processing position, a processing space 38 is formed between the stage 2 and the shower plate 32, and a top surface of the cover 22 and the annular protrusion 34 become close to each other so as to form an annular gap 39.

The exhauster 4 evacuates an interior of the processing container 1. The exhauster 4 includes an exhaust pipe 41 connected to the exhaust port 13b, and an exhaust mechanism 42 connected to the exhaust pipe 41 and having a vacuum pump, a pressure control valve, or the like. During a processing, a gas in the processing container 1 reaches the exhaust duct 13 via the slit 13a, and is exhausted from the exhaust duct 13 via the exhaust pipe 41 by the exhaust mechanism 42.

The gas supply mechanism 5 supplies the processing gas into the processing container 1. The gas supply mechanism 5 includes a gas supply 50a.

The gas supply 50a supplies an etching gas into the processing container 1 via a gas line 50b. A halogen-containing gas (e.g., $C_4F_8$ gas, HF gas, $CF_4$ gas), $NH_3$ gas, $H_2$ gas, an inert gas, or the like are supplied into the processing container 1 as the etching gas.

The gas line 50b is provided with a flow rate controller 50c and a valve 50d from an upstream side. A downstream side of the valve 50d of the gas line 50b is connected to the gas introduction hole 36. A gas supplied from the gas supply 50a is supplied into the processing container 1. A supply and stop of the gas from the gas supply 50a to the processing container 1 is performed by opening and closing the valve 50d.

In addition, the processing apparatus 101 is a capacitively coupled plasma apparatus, in which the stage 2 serves as a lower electrode and the shower head 3 serves as an upper electrode. The stage 2 serving as the lower electrode is grounded via a capacitor (not illustrated).

Radio frequency power (hereinafter, also referred to as "RF power") is applied to the shower head 3 serving as the upper electrode by the RF power supply 8. The RF power supply 8 includes a feed line 81, a matcher 82, and a radio frequency power source 83. The radio frequency power source 83 is a power source that generates radio frequency power. Radio frequency power has a frequency appropriate for plasma generation. The frequency of the radio frequency power is, for example, a frequency within a range of 450 KHz to 100 MHz. The radio frequency power source 83 is connected to the main body 31 of the shower head 3 via the matcher 82 and the feed line 81. The matcher 82 includes a circuit configured to match an output reactance of the radio frequency power source 83 and a reactance of a load (the upper electrode). Although the RF power supply 8 has been described as applying radio frequency power to the shower head 3 serving as the upper electrode, the present disclosure is not limited thereto. The RF power supply 8 may be configured to apply radio frequency power to the stage 2 serving as the lower electrode.

The controller 9 is, for example, a computer, and includes a central processing unit (CPU), a random access memory (RAM), a read only memory (ROM), an auxiliary storage device, and the like. The RAM, ROM, and auxiliary storage device may be computer readable storage devices. The CPU operates based on a program stored in the ROM or the auxiliary storage device, and controls an operation of the processing apparatus 101. The controller 9 may be provided either inside or outside the processing apparatus 101. In the case in which the controller 9 is provided outside the processing apparatus 101, the controller 9 is capable of controlling the processing apparatus 101 via a wired or wireless communication mechanism.

[Processing Apparatus 102]

Figure 3:
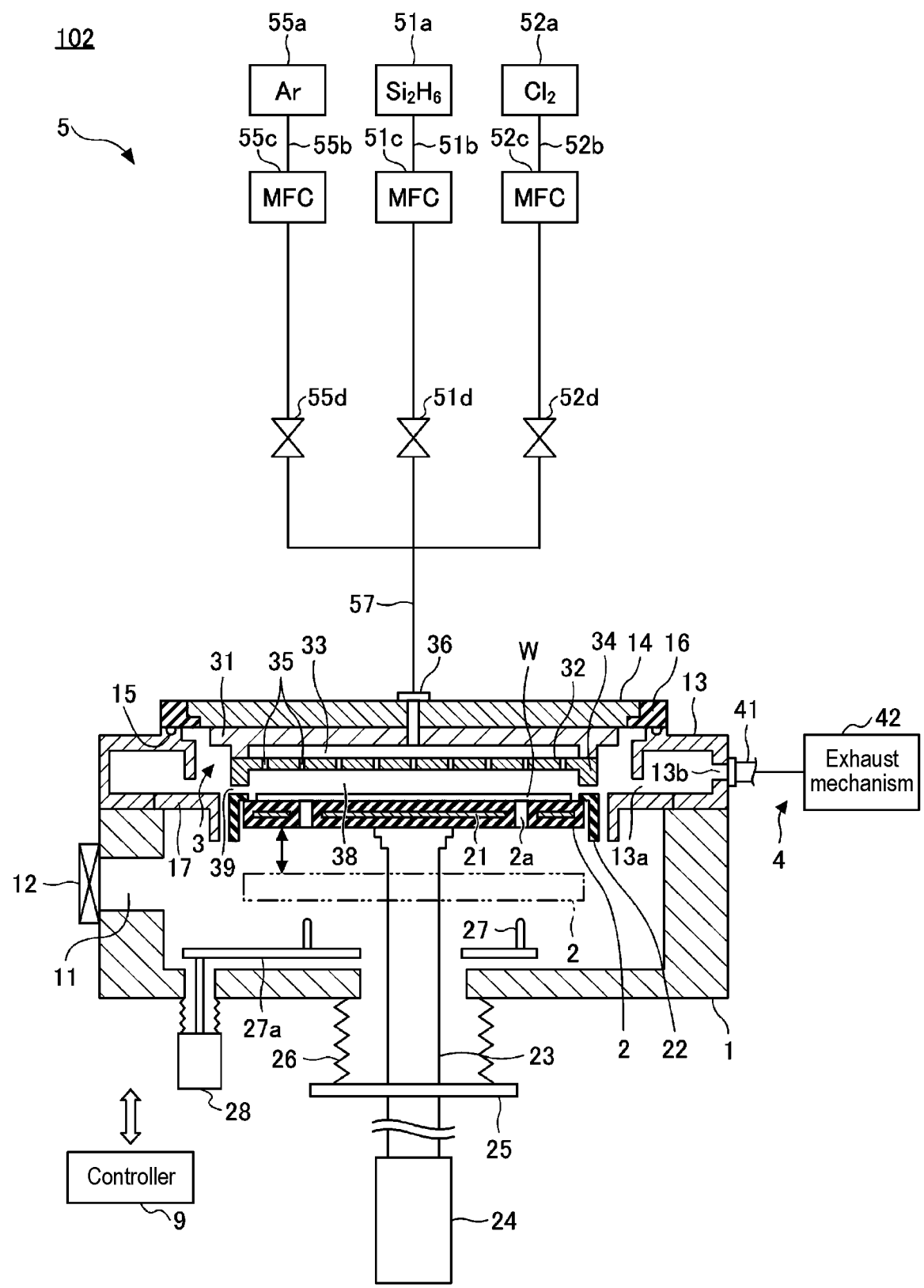
FIG. 3 is an example of a schematic view illustrating a configuration example of a processing apparatus.

Next, the processing apparatus 102 will be described with reference to FIG. 3. FIG. 3 is an example of a schematic view illustrating a configuration example of the processing apparatus 102. The processing apparatus 102 is an apparatus configured to selectively form a Si film at the bottom of the recess in the substrate W within the processing container 1 under a depressurized state.

As illustrated in FIG. 3, the processing apparatus 102 includes a processing container 1, a stage 2, a shower head 3, an exhauster 4, a gas supply mechanism 5, and a controller 9. In the processing apparatus 102, a description of a configuration overlapping with that of the processing apparatus 101 (see FIG. 2) will be omitted.

The gas supply mechanism 5 supplies a processing gas into the processing container 1. The gas supply mechanism 5 includes a silicon-containing gas supply 51a, a halogen-containing gas supply 52a, and an inert gas supply 55a.

The silicon-containing gas supply 51a supplies a silicon-containing gas into the processing container 1 via a gas line 51b. As the silicon-containing gas, for example, a gas containing at least one selected from the group of $SiH_4$ gas, $Si_2H_6$ gas, $SiH_2Cl_2$ gas, $Si_3H_8$ gas, $Si_4H_{10}$ gas, and the like may be used.

The gas line 51b is provided with a flow rate controller 51c and a valve 51d from an upstream side. A downstream side of the valve 51d of the gas line 51b is connected to a gas introduction hole 36 via a gas line 57. The silicon-containing gas supplied from the silicon-containing gas supply 51a is supplied into the processing container 1. A supply and stop of the silicon-containing gas from the silicon-containing gas supply 51a to the processing container 1 is performed by opening and closing the valve 51d.

The halogen-containing gas supply 52a supplies a halogen-containing gas into the processing container 1 via a gas line 52b. As the halogen-containing gas, for example, a gas containing at least one selected from the group of $Cl_2$ gas, HBr gas, $ClF_3$ gas, and the like may be used.

The gas line 52b is provided with a flow rate controller 52c and a valve 52d from an upstream side. A downstream side of the valve 52d of the gas line 52b is connected to the gas introduction hole 36 via the gas line 57. The halogen-containing gas supplied from the halogen-containing gas supply 52a is supplied into the processing container 1. A supply and stop of the halogen-containing gas from the halogen-containing gas supply 52a to the processing container 1 is performed by opening and closing the valve 52d.

The inert gas supply 55a supplies an inert gas into the processing container 1 via a gas line 55b. As the inert gas, for example, Ar gas or the like may be used.

The gas line 55b is provided with a flow rate controller 55c and a valve 55d from an upstream side. A downstream side of the valve 55d of the gas line 55b is connected to the gas introduction hole 36 via the gas line 57. The inert gas supplied from the inert gas supply 55a is supplied into the processing container 1. A supply and stop of the inert gas from the inert gas supply 55a to the processing container 1 is performed by opening and closing the valve 55d.

[Processing Apparatus 103]

Figure 4:
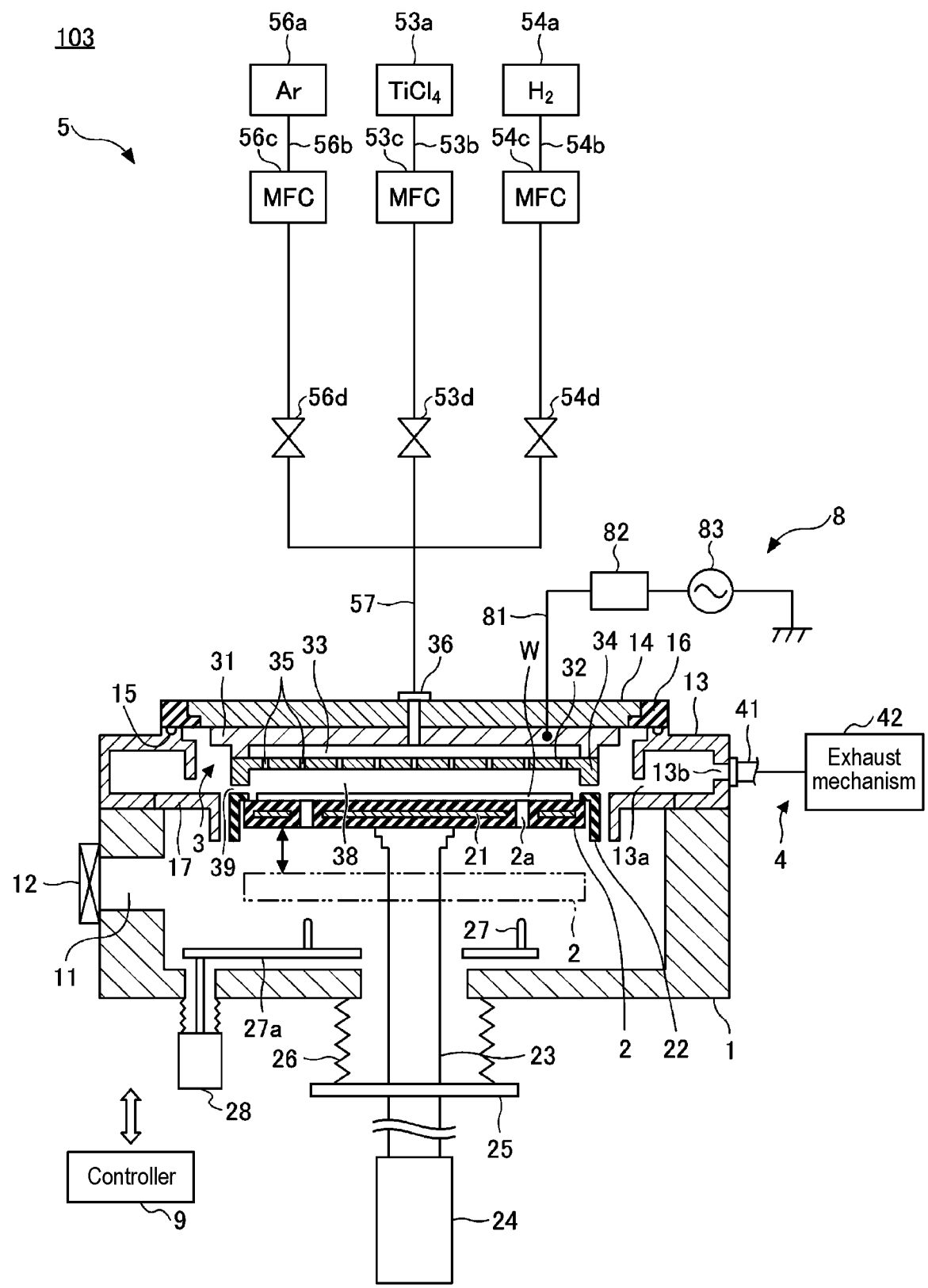
FIG. 4 is an example of a schematic view illustrating a configuration example of a processing apparatus.

Next, the processing apparatus 103 will be described with reference to FIG. 4. FIG. 4 is an example of a schematic view illustrating a configuration example of the processing apparatus 103. The processing apparatus 103 is an apparatus configured to form a metal film on the substrate W within the processing container 1 under a depressurized state. By forming the metal film, a metal silicide film is selectively formed at the bottom of the recess of the substrate W.

As illustrated in FIG. 4, the processing apparatus 103 includes a processing container 1, a stage 2, a shower head 3, an exhauster 4, a gas supply mechanism 5, an RF power supply 8, and a controller 9. In the processing apparatus 102, a description of a configuration overlapping with that of the processing apparatus 101 (see FIG. 2) will be omitted The gas supply mechanism 5 supplies a processing gas into the processing container 1. The gas supply mechanism 5 includes a metal-containing gas supply 53a, a reducing gas supply 54a, and an inert gas supply 56a.

The metal-containing gas supply 53a supplies a metal-containing gas into the processing container 1 via a gas line 53b. As the metal-containing gas, for example, a gas containing at least one selected from the group of $TiCl_4$ gas, $TiBr_4$ gas, and the like may be used.

The gas line 53b is provided with a flow rate controller 53c and a valve 53d from an upstream side. A downstream side of the valve 53d of the gas line 53b is connected to the gas introduction hole 36 via a gas line 57. The metal-containing gas supplied from the metal-containing gas supply 53a is supplied into the processing container 1. A supply and stop of the metal-containing gas from the metal-containing gas supply 53a to the processing container 1 is performed by opening and closing the valve 53d.

The reducing gas supply 54a supplies a reducing gas into the processing container 1 via a gas line 54b. As the reducing gas, for example, $H_2$ gas or the like may be used.

The gas line 54b is provided with a flow rate controller 54c and a valve 54d from an upstream side. A downstream side of the valve 54d of the gas line 54b is connected to the gas introduction hole 36 via the gas line 57. The reducing gas supplied from the reducing gas supply 54a is supplied into the processing container 1. A supply and stop of the reducing gas from the reducing gas supply 54a to the processing container 1 is performed by opening and closing the valve 54d.

The inert gas supply 56a supplies an inert gas into the processing container 1 via a gas line 56b. As the inert gas, for example, Ar gas or the like may be used.

The gas line 56b is provided with a flow rate controller 56c and a valve 56d from an upstream side. A downstream side of the valve 56d of the gas line 56b is connected to the gas introduction hole 36 via the gas line 57. The inert gas supplied from the inert gas supply 56a is supplied into the processing container 1. A supply and stop of the inert gas from the inert gas supply 56a to the processing container 1 is performed by opening and closing the valve 56d.

[Substrate Processing Method]

Next, a substrate processing method performed by the substrate processing system according to an embodiment will be described with reference to FIGS. 5 to 6E. FIG. 5 is an example of a flowchart illustrating a substrate processing method performed by the substrate processing system. FIGS. 6A to 6E are examples of cross-sectional views of a substrate W in respective processes.

In step S101, the controller 600 prepares a substrate W. The controller 600 controls the transfer mechanism 402 and the gate valve G31 to transfer the substrate W accommodated in a carrier C to the load-lock chamber 301 in the atmospheric atmosphere via the atmospheric transfer chamber 400. The controller 600 controls the load-lock chamber 301 to depressurize the interior of the load-lock chamber 301 to a vacuum atmosphere. The controller 600 controls the transfer mechanism 201 and the gate valves G21 and G11 to transfer the substrate W from the load-lock chamber 301 to the processing apparatus 101 and place the substrate W on the stage 2 of the processing apparatus 101. Thereafter, the controller 9 of the processing apparatus 101 controls the lifting mechanism 24 to lift the stage 2 from the transfer position to the processing position.

Figure 6A:
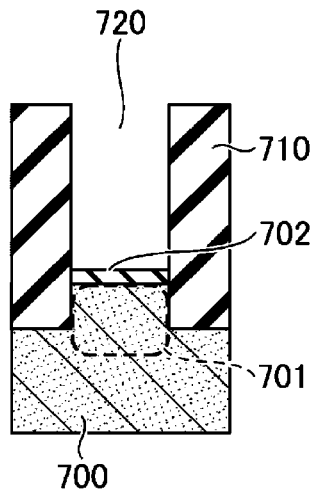
FIGS. 6A to 6E are examples of cross-sectional views of a substrate in respective processes.

Here, FIG. 6A illustrates an example of the prepared substrate W. The substrate W has a base 700 and an insulating film 710 formed on the base 700. The base 700 is made of, for example, Si or SiGe. The insulating film 710 is made of, for example, SiN or $SiO_2$. A penetration portion 720 is formed in the insulating film 710 so as to expose a surface of the base 700. That is, a recess is formed in the surface of the substrate W, and the surface of the base 700 is exposed at a bottom portion of the recess.

The base 700 includes an epitaxial layer 701 which is a crystalline silicon film formed by epitaxial growth. For example, in a fin-type channel field effect transistor, a source and a drain are formed by epitaxially growing Si or SiGe. In addition, a natural oxide film 702 is formed on the surface of the base 700 exposed from the penetration portion 720 (the bottom portion of the recess).

In step S102, the controller 600 controls the processing apparatus 101 to remove the natural oxide film 702 formed on the surface of the base 700 exposed from the penetration portion 720.

In the processing apparatus 101, for example, the RF power supply 8 applies radio frequency power to the shower head 3 serving as the upper electrode, and an etching gas (e.g., $C_4F_8$ gas), an inert gas, or the like is supplied from the gas supply 50a into the processing container 1, so that the natural oxide film 702 on the substrate W is removed by plasma etching. Alternatively, the processing apparatus 101 supplies an etching gas (e.g., HF gas) and a reactive gas (e.g., $NH_3$ gas) into the processing container 1 from the gas supply 50a, so that the natural oxide film 702 on the substrate W is removed by chemical etching. The method of removing the natural oxide film 702 performed in the processing apparatus 101 is not limited to those described above.

Figure 6B:
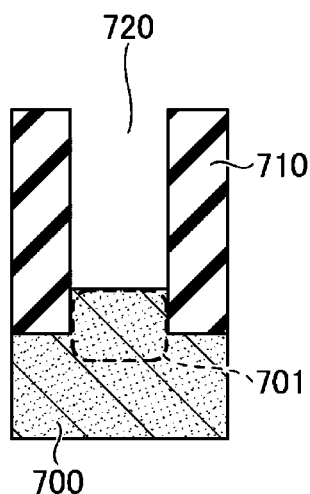

Here, FIG. 6B illustrates an example of the substrate W from which the natural oxide film 702 has been removed. By removing the natural oxide film 702, the surface of the base 700 exposed from the penetration portion 720 exposes a surface of the epitaxial layer 701, which is a crystalline silicon film.

In step S103, the controller 600 vacuum-transfers the substrate W from the processing apparatus 101 to the processing apparatus 102. The controller 9 of the processing apparatus 101 controls the lifting mechanism 24 to lower the stage 2 from the processing position to the transfer position. The controller 600 controls the transfer mechanism 201 and the gate valves G11 and G12 to transfer the substrate W from the processing apparatus 101 to the processing apparatus 102, and place the substrate W on the stage 2 of the processing apparatus 102. Thereafter, the controller 9 of the processing apparatus 102 controls the lifting mechanism 24 to lift the stage 2 from the transfer position to the processing position.

In step S104, the controller 600 controls the processing apparatus 102 to form a Si film on the substrate W.

In the processing apparatus 102, for example, a silicon-containing gas (e.g., monosilane ($SiH_4$) gas, disilane ($Si_2H_6$) gas, trisilane ($Si_3H_8$) gas, tetrasilane ($Si_4H_{10}$) gas, or a chlorine-containing gas such as chlorine monochlorosilane ($SiH_3Cl$) gas, dichlorosilane ($SiH_2C_2$) gas, trichlorosilane ($SiHCl_3$) gas, silicon tetrachloride ($SiCl_4$) gas, and hexachlorodisilane ($Si_2Cl_6$) gas) is supplied from the silicon-containing gas supply 51a into the processing container 1, so that a Si film is formed on the substrate W.

Figure 6C:
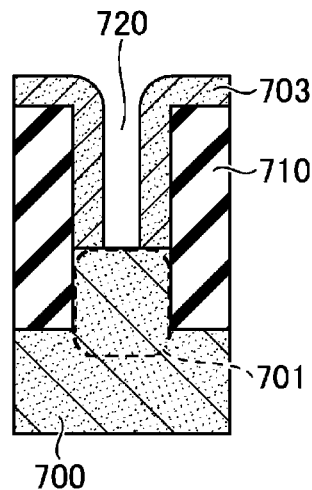

Here, FIG. 6C illustrates an example of the substrate W on which a Si film is formed by a process performed by the processing apparatus 102.

The epitaxial layer 701 made of Si or SiGe has been formed at the bottom portion of the recess. Therefore, at the bottom portion of the recess, a crystalline silicon film is formed by epitaxial growth from the epitaxial layer 701. Thus, it is possible to increase a film thickness of the epitaxial layer 701. On the other hand, an amorphous silicon film 703 is formed on a top surface of the insulating film 710 made of SiN or $SiO_2$ and on a side wall of the penetration portion 720. Due to the aforementioned difference in a base on which a Si film is formed, the crystalline silicon film (epitaxial layer 701) may be formed at the bottom portion of the recess, and the amorphous silicon film 703 may be formed on the side and top surfaces of the recess.

Figure 7A:
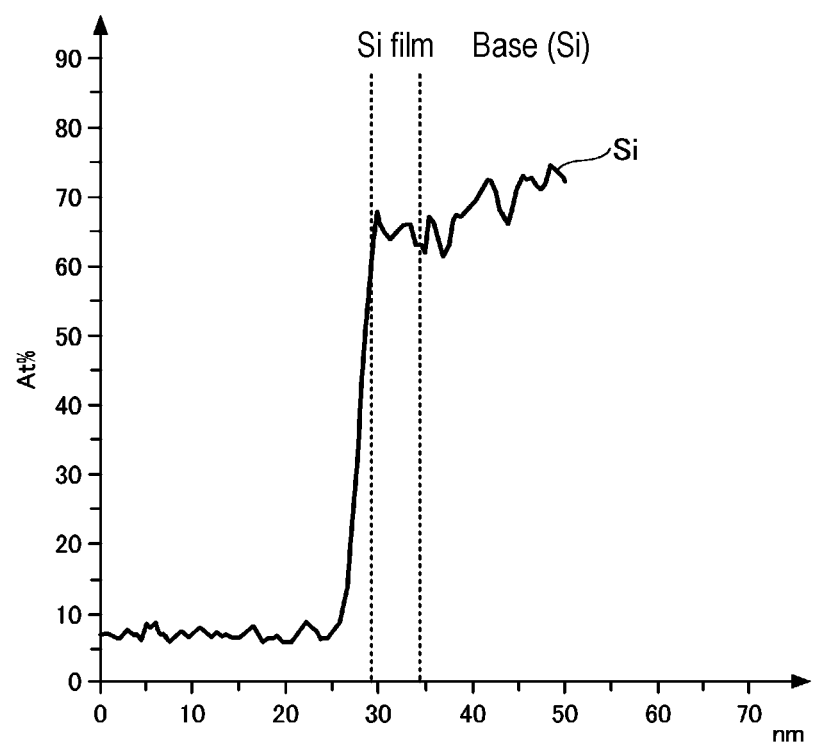
FIGS. 7A and 7B are examples of a graph showing a result of forming a Si film in the process illustrated in step S104.
Figure 7B:
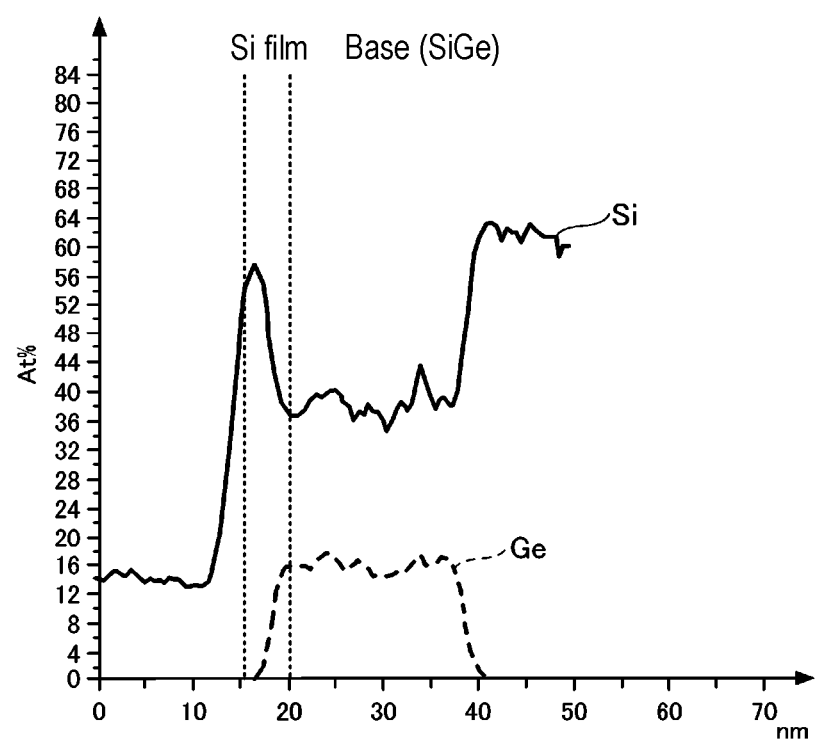

FIGS. 7A and 7B are examples of a graph showing a result of forming a Si film in the process illustrated in step S104. FIG. 7A shows a case where a Si film was formed on a Si base, and FIG. 7B shows a case where a Si film was formed on a SiGe base. Formation of the Si films was confirmed by an EDX analysis was performed with the horizontal axis representing a depth (nm) and the vertical axis representing a concentration (At %) of elements.

The Si films were formed under a condition including a stage temperature of 500 degrees C. to 600 degrees C., a pressure of 1 Torr to 10 Torr, $Si_2H_6$ gas as the silicon-containing gas of 10 sccm to 100 sccm, and Ar gas as the inert gas of 100 sccm to 5,000 sccm.

From the results of FIGS. 7A and 7B, it could be recognized that Si films can be formed on both the Si and SiGe bases.

When $Si_2H_6$ gas is used as the silicon-containing gas, by controlling the temperature of the substrate W from 400 degrees C. to 580 degrees C. during the formation of the Si film, a crystalline silicon film is formed on the surface of the epitaxial layer 701 (at the bottom portion of the recess), and an amorphous silicon film is formed on the top surface of the insulating film 710 and the side wall of the penetration portion 720 (the side wall of the recess). When $Si_4H_{10}$ gas is used as the silicon-containing gas, by controlling the temperature of the substrate W from 350 degrees C. to 480 degrees C., a crystalline silicon film is formed on the surface of the epitaxial layer 701 (at the bottom portion of the recess), and an amorphous silicon film is formed on the top surface of the insulating film 710 and the side wall of the penetration portion 720 (the side wall of the recess).

Returning to FIGS. 5 to 6E, in step S105, the controller 600 controls the processing apparatus 102 to selectively etch the amorphous silicon film 703.

The processing apparatus 102 supplies, for example, a halogen-containing gas (e.g., $Cl_2$ gas, HBr gas, or $ClF_3$ gas) from the halogen-containing gas supply 52a into the processing container 1, so that the Si film formed on the substrate W is chemically etched.

Figure 8:
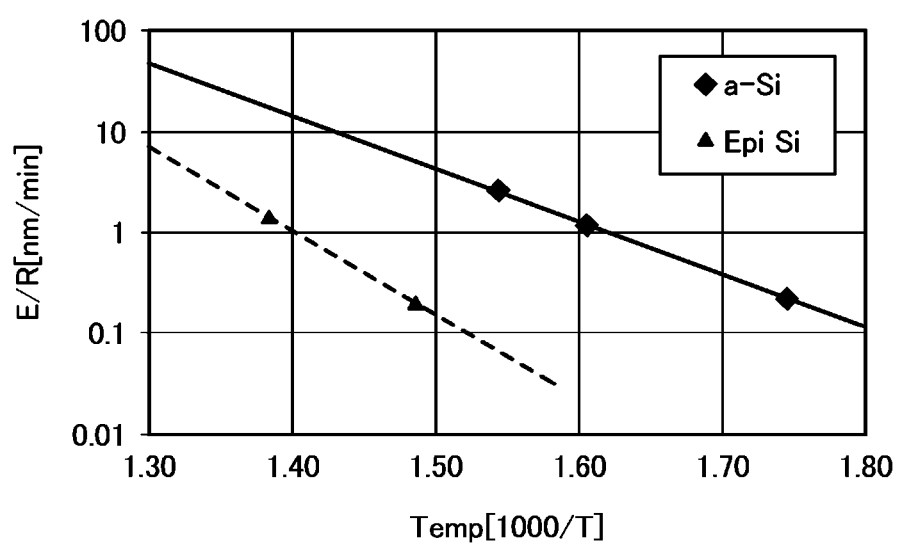
FIG. 8 is a graph showing an example of etching rates of an amorphous silicon film and a crystalline silicon film.

Here, etching rates of the amorphous silicon film and the crystalline silicon film will be described with reference to FIG. 8. FIG. 8 is a graph showing an example of etching rates of an amorphous silicon film and a crystalline silicon film. The horizontal axis represents a reciprocal of temperature 1000/T [1/Degrees C.]. The vertical axis represents an etching rate [nm/min]. The etching rate of the amorphous silicon film (a-Si) is indicated by the solid line, and the etching rate of the crystalline silicon film (EpiSi) is indicated by the broken line.

Here, the amorphous silicon film and the crystalline silicon film were chemically etched by using $Cl_2$ gas as the halogen-containing gas. In the example shown in the graph of FIG. 8, the etching rate of the amorphous silicon film is substantially ten times the etching rate of the crystalline silicon film. Thus, it is possible for the processing apparatus 102 to selectively etch the amorphous silicon film 703.

Figure 6D:
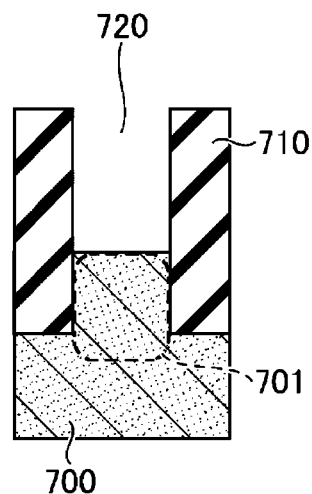
Figure 6E:
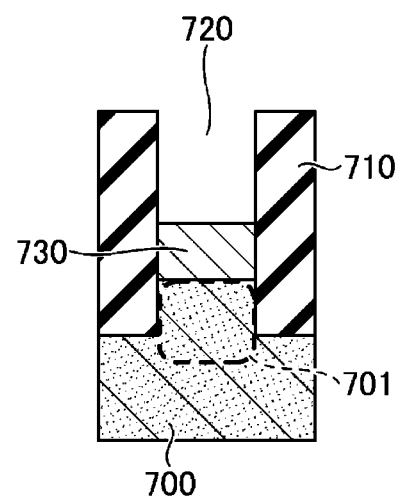

Here, FIG. 6D shows an example of the substrate W in which the amorphous silicon film 703 is selectively etched by the process performed by the processing apparatus 102. The amorphous silicon film 703 formed on the top surface of the insulating film 710 and the side wall of the penetration portion 720 is etched.

As described above, it is possible to selectively form the crystalline silicon film at the bottom portion of the recess by the processes of steps S104 and S105.

In addition, although the process of supplying the silicon-containing gas illustrated in step S104 and the process of supplying the halogen-containing gas illustrated in step S105 have been described as being sequentially performed, the present disclosure is not limited thereto.

For example, the silicon-containing gas and the halogen-containing gas may be supplied simultaneously. With such a configuration, it is possible to form the crystalline silicon film (epitaxial layer 701) at the bottom portion of the recess while suppressing formation of the amorphous silicon film 703 on the top surface of the insulating film 710 and the side wall of the penetration portion 720.

In addition, the process of supplying the silicon-containing gas illustrated in step S104 and the process of supplying the halogen-containing gas illustrated in step S105 may be repeated. With such a configuration, it is possible to selectively form the crystalline silicon film at the bottom portion of the recess.

In step S106, the controller 600 vacuum-transfers the substrate W from the processing apparatus 102 to the processing apparatus 103. The controller 9 of the processing apparatus 102 controls the lifting mechanism 24 to lower the stage 2 from the processing position to the transfer position. The controller 600 controls the transfer mechanism 201 and the gate valves G12 and G13 to transfer the substrate W from the processing apparatus 102 to the processing apparatus 103, and place the substrate W on the stage 2 of the processing apparatus 103. Thereafter, the controller 9 of the processing apparatus 103 controls the lifting mechanism 24 to lift the stage 2 from the transfer position to the processing position.

In step S107, the controller 600 controls the processing apparatus 103 to form a metal film (Ti film) on the substrate W.

For example, the processing apparatus 103 supplies a metal-containing gas (e.g., $TiCl_4$ gas or $TiBr_4$ gas) into the processing container 1 from the metal-containing gas supply 53a, supplies a reducing gas (e.g., $H_2$ gas) into the processing container 1 from the reducing gas supply 54a, and supplies an inert gas (e.g., Ar gas) into the processing container 1 from the inert gas supply 56a. Thereafter, radio frequency power is applied to the shower head 3 serving as the upper electrode by the RF power supply 8 to generate plasma, and the substrate W is exposed to the generated plasma, whereby a metal film (Ti film) is formed on the substrate W by a chemical vapor deposition (CVD) reaction.

Here, the metal film (e.g., Ti film) is formed on the epitaxial layer 701 at the bottom portion of the recess. The metal film reacts with the epitaxial layer 701 and forms a metal silicide film (TiSi film) 730 in a self-aligning manner (see FIG. 6E).

In addition, the metal film (Ti film) formed on the top surface of the insulating film 710 and the side wall of the penetration portion 720 is self-etched by the TiCl$_4$ gas. Therefore, formation of the metal film (Ti film) on the top surface of the insulating film 710 and the side wall of the penetration portion 720 is suppressed.

In addition, although it has been described that the metal film is a Ti film and the metal silicide film is a TiSi film, the present disclosure is not limited thereto.

After the processing is completed, the controller 600 vacuum-transfers the substrate W from the processing apparatus 103 to the load-lock chamber 301. The controller 9 of the processing apparatus 103 controls the lifting mechanism 24 to lower the stage 2 from the processing position to the transfer position. The controller 600 controls the transfer mechanism 201 and the gate valves G13 and G21 to transfer the substrate W from the processing apparatus 103 to the load-lock chamber 301. The controller 600 controls the load-lock chamber 301 to turn the interior of the load-lock chamber 301 into atmospheric atmosphere. The controller 600 controls the transfer mechanism 402 and the gate valve G31 to transfer the substrates W from the load-lock chamber 301 to a carrier C via the atmosphere transfer chamber 400, and accommodates the substrate W in the carrier C.

With the substrate processing method performed by the substrate processing system according to an embodiment, it is possible to selectively form the metal silicide film 730 at the bottom of the recess formed in the substrate W. With the substrate processing method performed by the substrate processing system, it is possible to remove the amorphous silicon film 703 formed on the top surface of the insulating film 710 and the side wall of the penetrating portion 720 by the process of step S105. Thus, it is possible to prevent a metal silicide film from being formed on the top surface of the insulating film 710 and the side wall of the penetrating portion 720 when a metal film is formed on the substrate W by the process of step S107. In addition, it is possible to appropriately form the metal silicide film 730 at a bottom portion of a recess having a high aspect ratio.

In addition, with the substrate processing method performed by the substrate processing system, it is possible to increase a thickness of the crystalline silicon film (epitaxial layer 701) formed at the bottom portion of the recess by the processes of steps S104 and S105. As a result, it is possible to increase the thickness of the metal silicide film 730 formed by the reaction between the metal film and the crystalline silicon film (epitaxial layer 701) by the process of step S107.

As described above, with the substrate processing method performed by the substrate processing system, it is possible to increase the thickness of the metal silicide film 730 formed at the bottom portion of the recess of the substrate W, and to prevent a metal silicide film from being formed on the top surface of an insulating film 710 and the side wall of a penetration portion 720.

In addition, for example, when the epitaxial layer 701 is a source and drain of a fin-type channel field effect transistor, it is possible to selectively form a contact, which is the metal silicide film 730, at the bottom portion of the recess and to control (increase) the film thickness.

In addition, the present embodiment is also applicable to a structure having a recess or a penetration portion in a lateral direction as in a gate-all-around field effect transistor, for example.

In addition, as for the formation of a Si film, although an embodiment in which the film formation is performed without using plasma has been described, the present disclosure is not limited thereto. For example, the RF power supply 8 of the processing apparatus 101 may be applied to the processing apparatus 102 to form the Si film with capacitively coupled plasma. In addition, without being limited to capacitively coupled plasma, for example, inductively coupled plasma (ICP), microwave excited surface wave plasma (SWP), electron cyclotron resonance plasma (ECP), or helicon wave excited plasma (HWP) is also applicable.

In addition, even when various materials co-exist as the material of the base 700, that is, when a part of a plurality of recesses has bottom portions formed of Si and another part of the recesses has bottom portions formed of SiGe, it is possible to selectively form a crystalline silicon film at the bottom portion of each of the recesses and to cause the formed crystalline silicon film to react with a metal film. Thus, it is possible to suppress variation in film thickness of the metal silicide film 730.

Although the embodiments of the substrate processing systems and the like have been described above, the present disclosure is not limited to the above-described embodiments and the like, and can be variously modified and improved within the scope of the gist of the present disclosure described in the claims.

According to the present disclosure, it is possible to provide a substrate processing method and a substrate processing system, which are capable of selectively forming a metal silicide film at a bottom portion of a recess formed in a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
   preparing a substrate which includes a base having an epitaxial layer formed by epitaxial growth, and an insulating film formed on the base and having a penetration portion that exposes the epitaxial layer;
   selectively forming a silicon film on a surface of the epitaxial layer exposed from the penetration portion; and
   selectively forming a metal film on the silicon film formed on the surface of the epitaxial layer, and causing the silicon film to react with the metal film to form a metal silicide film such that the metal silicide film extends to adjacent side walls of the penetration portion,
   wherein the selectively forming the silicon film includes:
   forming the silicon film by supplying a silicon-containing gas; and
   removing the silicon film formed on a side wall of the penetration portion by supplying a halogen-containing gas,
   wherein, in the forming the silicon film, the silicon film is formed to cover the penetration portion, the silicon film formed on a bottom of the penetration portion is crystalline silicon, and the silicon film formed on the side wall of the penetration portion is amorphous silicon, and wherein, in the removing the silicon film, the amorphous silicon formed on the side wall of the penetration portion is selectively removed.

2. The substrate processing method of claim 1, wherein the forming the silicon film includes repeating the forming the silicon film and the removing the silicon film.

3. The substrate processing method of claim 2, wherein the silicon-containing gas includes at least one selected from the group consisting of $SiH_4$ gas, $Si_2H_6$ gas, $SiH_2Cl_2$ gas, $Si_3H_8$ gas, and $Si_4H_{10}$ gas, and wherein the halogen-containing gas includes at least one selected from the group consisting of $Cl_2$ gas, HBr gas, and $ClF_3$ gas.

4. The substrate processing method of claim 3, wherein the forming the metal film to form the metal silicide film includes supplying a metal-containing gas and a reducing gas to generate plasma, and exposing the substrate to the plasma to form the metal film.

5. The substrate processing method of claim 4, wherein the metal-containing gas includes at least one selected from the group consisting of $TiCl_4$ gas and $TiBr_4$ gas, and wherein the reducing gas includes $H_2$ gas.

6. The substrate processing method of claim 5, wherein the insulating film is SiN or $SiO_2$, and wherein the epitaxial layer contains Si or SiGe.

7. The substrate processing method of claim 6, further comprising, before the forming the silicon film, removing an oxide film formed on the surface of the epitaxial layer exposed from the penetration portion.

8. The substrate processing method of claim 7, wherein the removing the oxide film, the forming the silicon film, and the forming the metal film to form the metal silicide film are performed without breaking a vacuum.

9. The substrate processing method of claim 1, wherein the silicon-containing gas includes at least one selected from the group consisting of $SiH_4$ gas, $Si_2H_6$ gas, $SiH_2Cl_2$ gas, $Si_3H_8$ gas, and $Si_4H_{10}$ gas, and wherein the halogen-containing gas includes at least one selected from the group consisting of $Cl_2$ gas, HBr gas, and $ClF_3$ gas.

10. The substrate processing method of claim 1, wherein the forming the silicon film includes simultaneously supplying a silicon-containing gas and a halogen-containing gas.

11. The substrate processing method of claim 1, wherein the forming the metal film to form the metal silicide film includes supplying a metal-containing gas and a reducing gas to generate plasma, and exposing the substrate to the plasma to form the metal film.

12. The substrate processing method of claim 11, wherein the metal-containing gas includes at least one selected from the group consisting of $TiCl_4$ gas and $TiBr_4$ gas, and wherein the reducing gas includes $H_2$ gas.

13. The substrate processing method of claim 1, wherein the insulating film is SiN or $SiO_2$, and wherein the epitaxial layer contains Si or SiGe.

14. The substrate processing method of claim 1, further comprising, before the forming the silicon film, removing an oxide film formed on the surface of the epitaxial layer exposed from the penetration portion.

15. The substrate processing method of claim 14, wherein the removing the oxide film, the forming the silicon film, and the forming the metal film to form the metal silicide film are performed without breaking a vacuum.

* * * * *